(12) United States Patent
Kruit et al.

(10) Patent No.: US 8,134,135 B2
(45) Date of Patent: Mar. 13, 2012

(54) MULTIPLE BEAM CHARGED PARTICLE OPTICAL SYSTEM

(75) Inventors: Pieter Kruit, Delft (NL); Yanxia Zhang, Delft (NL); Martijn J. Van Bruggen, Delft (NL); Stijn Willem Herman Karel Steenbrink, Delft (NL)

(73) Assignee: Mapper Lithography IP B.V., Delft (NL)

( * ) Notice: Subject to any disclaimer, the term of this patent is extended or adjusted under 35 U.S.C. 154(b) by 598 days.

(21) Appl. No.: 11/880,872

(22) Filed: Jul. 23, 2007

(65) Prior Publication Data

US 2008/0023643 A1 Jan. 31, 2008

Related U.S. Application Data

(60) Provisional application No. 60/833,394, filed on Jul. 25, 2006.

(51) Int. Cl.
*H01J 37/302* (2006.01)
*H01J 37/04* (2006.01)

(52) U.S. Cl. .............. 250/492.22; 250/491.1; 250/492.2; 250/492.24

(58) Field of Classification Search .............. 250/492.23, 250/492.2, 492.1, 492.22, 346, 396 ML, 250/492.21
See application file for complete search history.

(56) References Cited

U.S. PATENT DOCUMENTS

| | | | | |
|---|---|---|---|---|
| 6,734,428 B2* | 5/2004 | Parker et al. | | 850/9 |
| 6,750,455 B2* | 6/2004 | Lo et al. | | 250/346 |
| 6,844,550 B1* | 1/2005 | Yin et al. | | 850/9 |
| 6,870,171 B2* | 3/2005 | Hosoda et al. | | 250/492.22 |
| 6,903,353 B2* | 6/2005 | Muraki et al. | | 250/492.22 |
| 6,969,862 B2* | 11/2005 | Muraki et al. | | 250/492.22 |
| 2003/0122087 A1* | 7/2003 | Muraki et al. | | 250/492.2 |
| 2004/0135102 A1* | 7/2004 | Muraki et al. | | 250/492.22 |
| 2004/0188636 A1* | 9/2004 | Hosoda et al. | | 250/492.22 |
| 2005/0006601 A1* | 1/2005 | Muraki et al. | | 250/492.22 |
| 2005/0006603 A1* | 1/2005 | Muraki et al. | | 250/492.23 |
| 2005/0029473 A1* | 2/2005 | Muraki et al. | | 250/492.1 |
| 2005/0230633 A1* | 10/2005 | Lo et al. | | 250/396 ML |
| 2005/0279952 A1* | 12/2005 | Ishitani et al. | | 250/492.21 |
| 2006/0097197 A1* | 5/2006 | Sakaguchi | | 250/492.21 |
| 2006/0108531 A1* | 5/2006 | Lo et al. | | 250/346 |
| 2009/0026389 A1* | 1/2009 | Platzgummer | | 250/492.2 |

FOREIGN PATENT DOCUMENTS

EP 0 658 914 A 6/1995

(Continued)

*Primary Examiner* — Jack I Berman
*Assistant Examiner* — Johnnie L Smith
(74) *Attorney, Agent, or Firm* — Blakely, Sokoloff, Taylor & Zafman

(57) ABSTRACT

The invention relates to a multiple beam charged particle optical system, comprising an electrostatic lens structure with at least one electrode, provided with apertures, wherein the effective size of a lens field effected by said electrode at a said aperture is made ultimately small. The system may comprise a diverging charged particle beam part, in which the lens structure is included. The physical dimension of the lens is made ultimately small, in particular smaller than one mm, more in particular less than a few tens of microns. In further elaboration, a lens is combined with a current limiting aperture, aligned such relative to a lens of said structure, that a virtual aperture effected by said current limiting aperture in said lens is situated in an optimum position with respect to minimizing aberrations total.

43 Claims, 4 Drawing Sheets

FOREIGN PATENT DOCUMENTS

| | | |
|---|---|---|
| EP | 1 383 158 A2 | 1/2004 |
| GB | 2 034 516 A | 6/1980 |
| WO | WO-2004/081910 A | 9/2004 |
| WO | WO-2005/024881 A | 3/2005 |
| WO | WO-2007/028596 A | 3/2007 |

* cited by examiner

MULTIPLE BEAM CHARGED PARTICLE OPTICAL SYSTEM

The present patent application is a non-provisional application claiming the priority of U.S. Provisional Application No. 60/833,394, filed Jul. 25, 2006.

BACKGROUND OF THE INVENTION

The present invention relates to a charged particle beam system such as an electron beam exposure system, scanning and non-scanning electron microscopes, and the like.

1. Field of the Invention

The current invention presents a microlens array for generating a plurality of focused beamlets or focusing beams with different incident angles in a charged particle beam exposure or imaging apparatus with zero field curvature, minimized geometrical aberrations such as coma and astigmatism, comprising a current limiting aperture, generating a plurality of charged particle beamlets, a lens array aligned with the current limiting aperture, for focusing all the beamlets into a flat image plane. It solves the problem of how to generate a plurality of focussed beamlets with a minimum of aberrations in a diverging beam system, such as in multi-beamlet inspection systems, in particular desired at a limited source to target distance such as in a multi beamlet, maskless lithography system.

2. Description of Related Art

The progress in microelectronics, microfabrication and material science demand an ever-increasing spatial resolution and throughput in charged particle beam lithography and inspection. Conventional single beam systems suffer from coulomb blur and low throughput. Several charged particle beam systems featuring multi-beam, multi-column and/or multi-source are under development to solve the contradictory requirements. To increase the throughput of charged particle beam systems and avoid coulomb blur however, a large exposure field is desired, which requires the use of not only axial, but also off-axial beam of the diverging beam emitted from a charged particle emitting source. By introducing a lens array that can generate a plurality of focused beams, i.e. can focus beams with different incident angles Coulomb blur can be avoided as disclosed by Applicants earlier patent publication cited hereafter. At the same time, a tight control of the off-axial aberrations is desired.

In JP60031225, JP60039828 and J. Vac. Sci. Technol. B 4(5), September/October 1986, an electron matrix lens with reduced aberrations is disclosed where the centre of a current limiting aperture is shifted from the optical axis of a lens associated with said aperture, to an optimum position. The position of the current limiting aperture, which is fabricated in a separate plate, is chosen such that a virtual aperture, which is symmetrical along the optical axis, is in a position causing the total aberration for off-axial lenses to be minimal. Patent publication JP60042825 discloses a correction means for the field curvature for each lens, by changing the focus using a correction lens matrix. However, the astigmatism becomes dominant with increasing incident angle and eventually restricts the maximum incident angle to less than 30 mrad, thus the throughput of the system is limited. The throughput of the system is also restricted due to a small filling factor of the lens that is allowed.

In WO2004/081910 in the name of Applicant, a lens array forming a plurality of focused beamlets from a diverging broad beam is disclosed. FIG. 10A thereof discloses a schematic of an example of the lens array, but does not indicate what the position of the electrode must be with respect to the beam. In order to reduce aberrations, the lens is, in a particular embodiment, concaved with respect to the source so that the off-axial beamlets can pass the lens along the optical axis. In this solution, the curvature of the lens plate leads to undesired engineering challenges. Also, drawbacks include that the image plane for all the beamlets is present in a concaved surface with respect to the source. Further, a difficulty exists in the alignment between the lens array and a "spatial filter", in fact the current limiting aperture structure, which in this publication is taught to be on a planar surface.

BRIEF SUMMARY OF THE INVENTION

It is a particular objective of present invention to realise a micro lens structure as is conceptually disclosed in the latter said WO publication.

It is a further objective of the invention to realise an alternative, in particular improved lens structure with respect to the lens structure as disclosed in the first said JP publications.

It is also an objective of the present invention to create a flat image plane for a micro lens positioned in a diverging beam.

A further objective of the invention is to minimize the image aberrations for the realised lens array.

Another objective of this invention is to improve the resolution of charged particle beam systems departing from a source with at least one diverging charged particle beam.

Again another objective of this invention is to improve the throughput of such charged particle beam systems.

Yet another object of this invention is to control the uniformity of the beams.

So as to meet at least part of these objectives, the present invention relates to charged particle optical system as defined in claim 1. With this measure according to the invention, the dimension of the effective electric field height is reduced by a factor of thousand relative to the prior art micro lens structures, resulting in strongly reduced chance of effectively having a beamlet passing through a lens part with strongly suboptimal conditions with respect to image aberrations. Though it could perhaps be possible to optimise the measure according to the invention, such will be performed by dimensioning the lens with changes within order of the new lens and effective field size, i.e. will remain within the order of ultimate smallness as claimed, totally different in effect and basic principle than the measure that has been taken with the present invention.

The invention, in a further elaboration thereof also relates to an apparatus for generating a plurality of focused charged particle beamlets or focusing beams with different incident angles in charged particle beam systems, comprising:
a) a current limiting aperture array located either before or after the lens array, to split up the diverging charged particle beam into a plurality of charged particle beamlets;
b) a lens array comprising a plurality of lenses to focus the beamlets with different incident angles into a plane;
c) the above said current limiting aperture being aligned with the lens in the lens array for a beamlet with a particular incident angle such that the virtual aperture is symmetrical along the optical axis and is located optimised in the lens with respect to resulting aberrations, e.g. by a, though not necessarily, centred location.

In this way, it is possible to improve the throughput by maximally utilizing the diverging current emitted from a source with sufficient beamlets per area on the surface of target. Furthermore, having sufficient large current per beamlet is in accordance with an insight and purpose underlying the present invention possible by minimizing the aberration for each lens. Having minimised the total of aberrations allows for increasing the opening angle of a beamlet, which favourably increases current. Also, homogeneity of the beamlets in terms of aberrations and current can be controlled by adjusting the parameter of the lenses in the lens array.

In an embodiment, the current limiting aperture is aligned with each lens in the lens array. The current limiting aperture is according to invention preferably fabricated on the same plate as either the first or the last lens electrode, but can be on a separate plate. The current limiting aperture is positioned in a field free region, while the diameter, more in general the size, largeness or magnitude of use surface area, of the current limiting aperture may change for homogeneity of beam currents, in particular as a function of its distance to the centre of the lens array.

In a further elaboration, the lens array comprises of two planar electrodes, which are in a separation of less than a few tens of microns. The two electrodes are aligned with respect to each other. The bore diameters, in general the bore size, in the two electrodes are the same, and smaller than the thickness of the electrodes to limit the lens field from penetrating deep into the lens holes, alternatively denoted lens apertures. The lens size, in the specific embodiment of a cylindrical opening, the diameter, increases for off-axial lenses for field curvature correction.

In another embodiment, the lens array comprises of a single planar electrode, with at least two, preferably three macro-electrodes facing the lens holes. The first electrode has the same or higher potential as the aperture lens electrode, while the second electrode has a higher potential than the first electrode, and the third electrode has a lower potential than the second electrode. The diameter of the said aperture lens is smaller than the thickness of the said lens electrode to limit the lens field from penetrating deep in to the lens holes. In a further elaboration, having realised that the field penetrating from the macro-electrodes forms the aperture lens effect in the aperture lens holes, the strength of the off-axial aperture lens in the aperture lens array is made weaker by having the field in front of the said aperture lens weaker than that of the central lens. In this way, by using the larger focal length at the off axial lenses, the field curvature is corrected, i.e. the image plane is brought into a planar surface. The lens diameter preferably increases for off-axial lenses for field curvature correction.

In yet a further embodiment, the lens array comprises three planar electrodes and the opening angle limiting aperture is made on a separate plate. The three electrodes are aligned in such a way that the centre of the beam with a specific incident angle passes through the centre of each electrode. The size of the lens hole cross section, e.g. expressed by a diameter, is preferably made larger for off-axial lenses for field curvature correction.

In yet a further elaboration, irrespective of any specific embodiment, the lens holes are made elliptical for correction of astigmatism. It is in this respect to be noted that in principle, most if not all of the features described as embodiments or not in this document, may be combined.

For each type of lens array, different microfabrication process flows have been developed, aiming at high productivity and better lens performance, the details of which are not described here. Further, the present invention may alternatively also be defined as in the following, paragraphed definitions.

A micro-lens array with limited lens field: in case of a two-electrode lens array, the separation between two electrodes is less than a few tens of microns, and the lens bore diameter, in case of an elliptical shape, the smallest diameter, is smaller than the thickness of the lens electrode; in case of aperture lens array, the lens diameter is smaller than the thickness of the electrodes. In this way, the third order aberrations, especially coma and astigmatism, will be minimized for off-axial beamlets.

The first order field curvature due to a longer objective distance for off-axial beamlets is compensated by increasing the radius of the off-axial lens holes, so that each lens of the lens array focuses a beamlet at the same image plane For the aperture lens array, alternatively, the field curvature can be corrected by adding three macro electrodes facing the lens aperture, with the potential of the first macro electrode the same or higher as that of the aperture lens array. This configuration leads to a curved equal-potential plane in front of the aperture lens array. The curvature of the equal-potential plane leads to a smaller aperture lens strength for the off-axial lenses than that of the central lens, and in this way, the field curvature can be corrected.

The apparatus mentioned above can be either an aperture lens with shifted current limiting apertures, a two electrode microlens array made of a SOI wafer or a two electrode microlens array by bonding of two wafers.

Alternatively, a three-electrode lens array can be used for generating a plurality of beamlets or focusing beams with different incident angles, where the lens electrodes are skewed in such a way that the centre of the beam passes through the center of each electrode. The field curvature may be corrected by increasing lens radius for off-axial lens in the lens array. Elliptical lens holes may be used to correct astigmatism. In this case, the current limiting aperture is made on a separate plate.

The current limiting apertures said in above definitions and the first or last lens electrode are made of one piece of wafer, the alignment is done with optical lithography. The current limiting apertures mentioned in the above definitions is in a field free region by limiting the lens bore diameter smaller than the electrode thickness. The diameter of the current limiting aperture may change for homogeneity of beamlet currents.

BRIEF DESCRIPTION OF THE DRAWINGS

The invention will, by way of example be further elucidated in the following embodiments of a charged particle optical system according to the current invention, in which.

In the figures, corresponding structural features, i.e. at least functionally, are referred to by identical reference numbers.

DETAILED DESCRIPTION OF THE INVENTION

Figure 1:
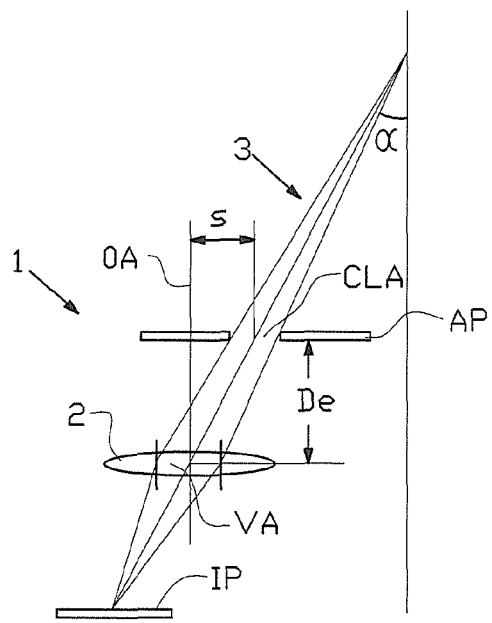
FIG. 1 is a schematic illustration of a charged particle or light optic beam passing a lens system with a lens and a beam current limiting opening.

FIG. 1 shows an alignment of a current limiting aperture CLA, normally part of an array of such apertures CLA and included in an aperture plate AP, and a lens 2. The current limiting aperture CLA of the lens is in such a position, that for a beam 3, such as a charged particle beam, with a certain incident angle α, the virtual aperture VA is located in a centre part of the lens 2, and symmetrical along the optical axis OA of the lens. Here, the middle, i.e. centre of the lens means the geometry centre of the lens. In case of a two electrode lens, the middle of the lens is at the middle of two electrodes and the in case of three electrode lens, the middle of the lens is at the middle of the central electrode, and in case of an aperture lens, the middle of the lens is at the end plane of the aperture. The image further shows an image plane IP.

Figure 2:
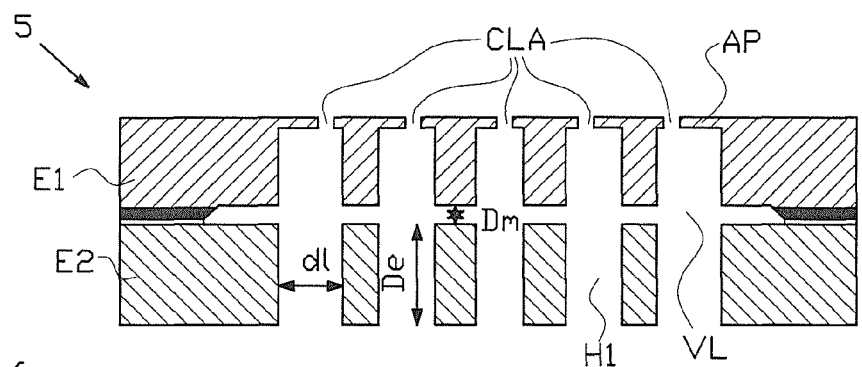
FIG. 2 illustrates a two-electrode micro lens, here created by bonding of two wafers, and showing a shifted apertures.
Figure 3:
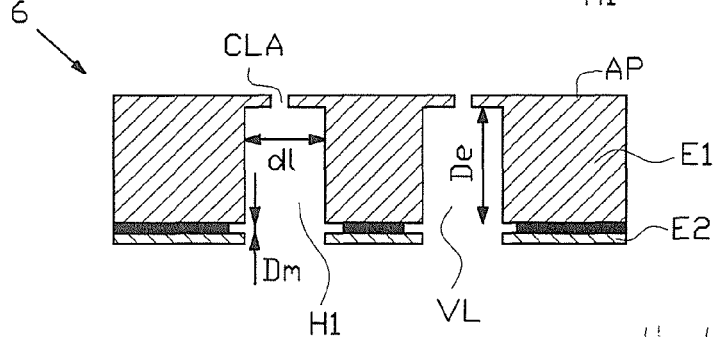
FIG. 3 represents an alternative to the embodiment of FIG. 2, by having an electrode produced of an SOI wafer.

In FIG. 2 and FIG. 3, two examples of two-electrode lens arrays are presented in the form of lens structures 5, 6, in short also denoted lenses. Compared to conventional charged particle lenses, where the filling factor is typically 10%, the filling factor for the present two-electrode lenses can be 85% and even higher, without significant increase in coma, astigmatism and field curvature. These lens structures come with aperture plates AP, which are here integrated with one electrode, thereby forming a so-called integrated aperture lens array. In the lens structures, the two electrodes are aligned with each other. The lenses show cylindrical holes H1, of which the diameter d1 is smaller than the thickness De of the first electrode. The effect of such measure being that the effective electric field Ef, illustrated in FIG. 9, of the lens is prevented from penetrating deep into the lens holes H1. The current limiting aperture CLA is fabricated on the first lens electrode, and is positioned in a field free region. The radius of off-axial lens hole H1 increases in order to correct the first order field curvature, and, surprisingly, the radius variation appears to have a large effect on the lens strength, more than enough to correct the first order field curvature. By doing so, the sizes of the images formed by the lens array are equal to each other, and without inducing further aberrations.

Figure 4:
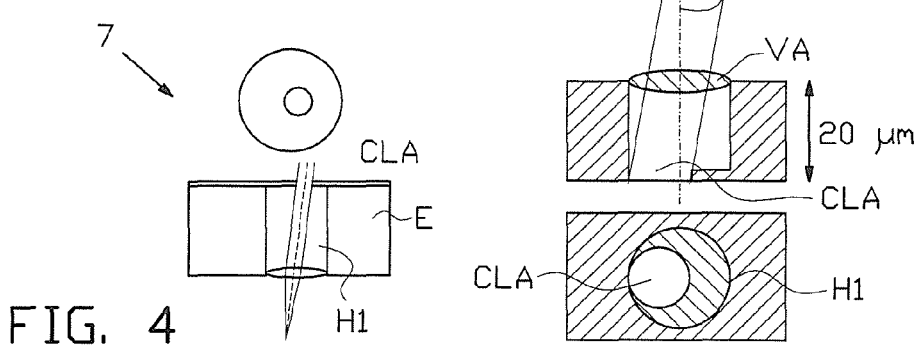
FIG. 4 schematically illustrates two equivalent integrated aperture lenses with shifted current limiting aperture.

In FIG. 4, a schematic of an aperture lens is shown, where the aperture plate AP with current limiting aperture CLA and the lens holes H1 are made of a piece of wafer. The current limiting aperture CLA is in such a position that the virtual aperture VA is at the end plane of the electrode E and symmetric along the optical axis. The lens bore diameter d1 is smaller than the thickness De of the electrode in order to limit a pertaining lens field Ef from penetrating deep into the lens holes H1. The right hand side of FIG. 4 indicates an equivalent version wherein the sequence of lens opening or electrode and the current limiting aperture array is inversed with respect to the direction of an incident beamlet.

Figure 5:
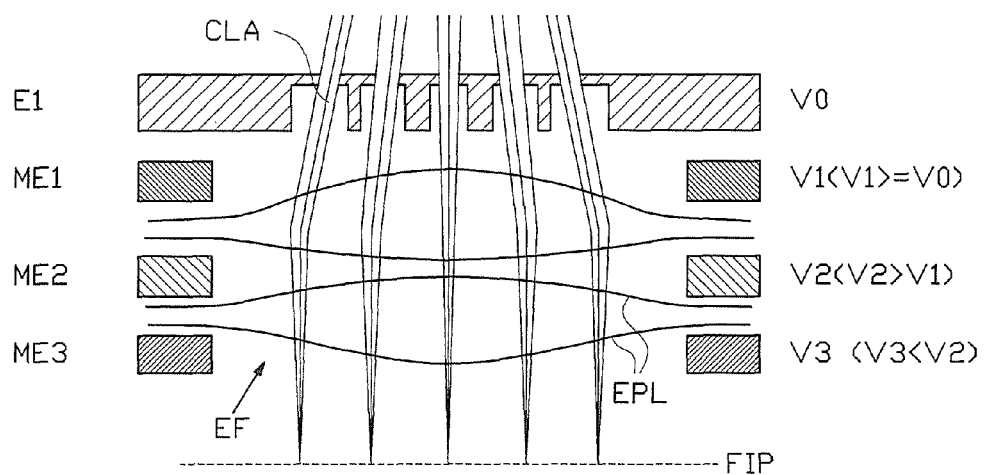
FIGS. 5 and 6 illustrate embodiments of an aperture lens array combined with three macro lenses, FIG. 6 thereby illustrating the working of equipotential lines, and the requirement to consider the same at the location of a lens array.

In FIG. 5, an example of an aperture lens array, here an integrated aperture lens array IAL is shown, with three macro electrodes ME1, ME2 and ME3 facing the aperture lens, i.e. all of the beams that are passed through the aperture lens array, pass the set of macro-electrodes ME1, ME2 and ME3, in the central part thereof. The first electrode ME1 is at a same or higher potential V1 as a potential V0 at the aperture lens IAL, i.e. V0=<V1, while the second electrode ME2 is at a higher potential V2 than V1, i.e. V2>V1. The third large electrode ME3 is at a potential V2 smaller than that V2 of ME2, i.e. V3=<V2. The figure indicates equi-potential lines EPL for this alternative embodiment. Aperture lenses are here formed at the lower end of a bore or lens hole H1. It may be clear form the illustration that with the equipotential lines locally being closer to one another and to the aperture lens AL, the central aperture lens, or lenses as the case may be in larger embodiments, is respectively are stronger than that of relatively off-axial aperture lenses. Thus the central aperture lens is stronger than the off-axial lenses, which phenomenon is here used for field curvature correction. In fact an increased focal length at the off axis lens holes causes, the normally curved image plane to become, at least virtually, flat. Alternatively and additionally when desired, the field curvature is also corrected using increasing lens size, here, with circularly shaped apertures, with increasing radius d1, for off-axial aperture lenses AL. The images formed by the present aperture lens array IAL are projected onto a flat image plane FIP.

Figure 6:
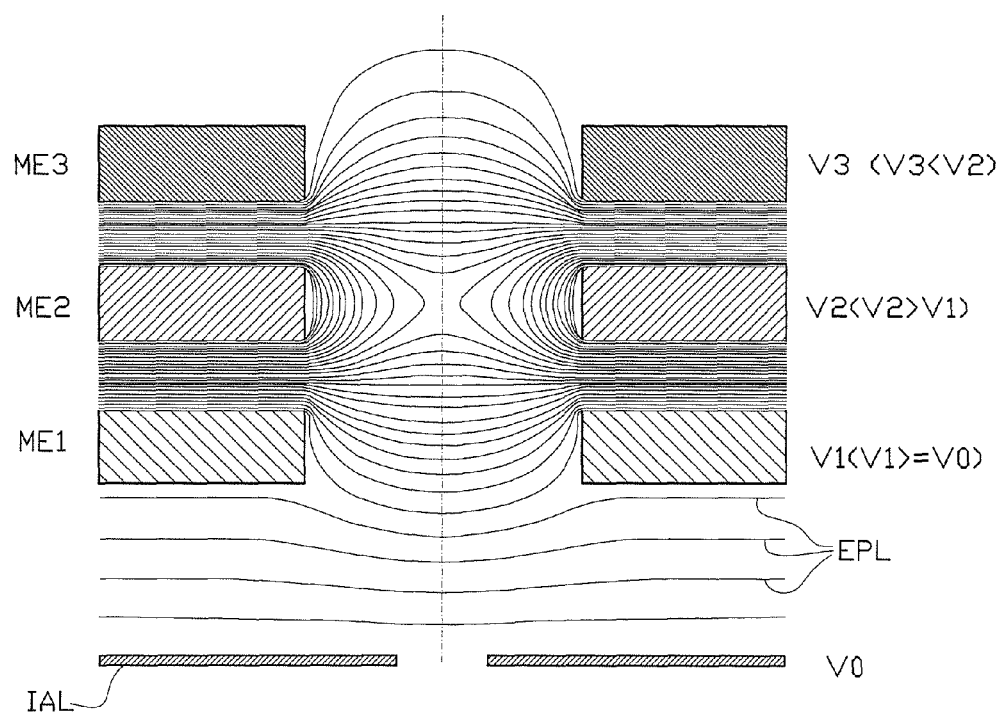

FIG. 6 provides a functionally equivalent example of a largely inversed arrangement, wherein the current limiting apertures are located downward from the macro-lenses ME1-ME3 in view of the main direction of the beamlets 3, and with appropriately adapted voltages. Where the example of FIG. 5 provides for a collimating effect of the macro lenses on the beamlets, in the present example the arrangement may be set into a zero strength mode and a non-zero strength mode of operation. The non-zero mode is here illustrated and provides for a corresponding focusing effect as is the case in the FIG. 5 arrangement, while in the non-depicted zero strength mode, the field is solely applied for generating a plurality of focused beams with to function with field curvature correction. Because the aberrations are proportional to the refraction power of the lens, thus when the macro lens is operating at zero strength mode, the aberrations, in particularly, field curvature and chromatic deflection error, are small, i.e. zero strength macro lens does not introduce extra aberrations.

FIG. 6 furthermore illustrates the effect of equipotential lines in a said three macro-lens lens structure in slight more detail, and also shows the electric field effect of the macro lenses ME1-ME3. The figure in particular illustrates how the equipotential lines are most close to one another in the most centered lens holes, and somewhat further away from one another at the off-axial lens holes.

Figure 7:
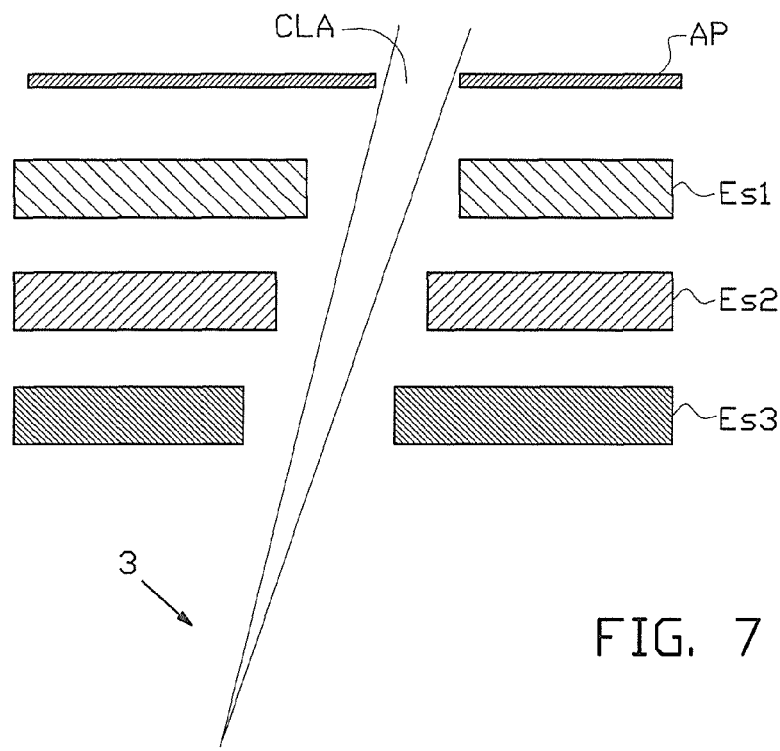
FIG. 7 illustrates a micro-einzel-lens with shifted electrodes.

FIG. 7 shows a 3-electrode lens, comprising a current limiting aperture CLA made in a separate aperture plate AP, and 3 electrodes Es1-Es3. The current limiting aperture CLA is aligned to the three electrodes Es1-Es3 in such way that the virtual aperture VA is in the centre part of the middle electrode and symmetrical along the optical axis of each lens. The three electrodes E1-E3 are skewed in such a way that the centre of the beam passes through the center of each electrode hole H1.

Figure 8:
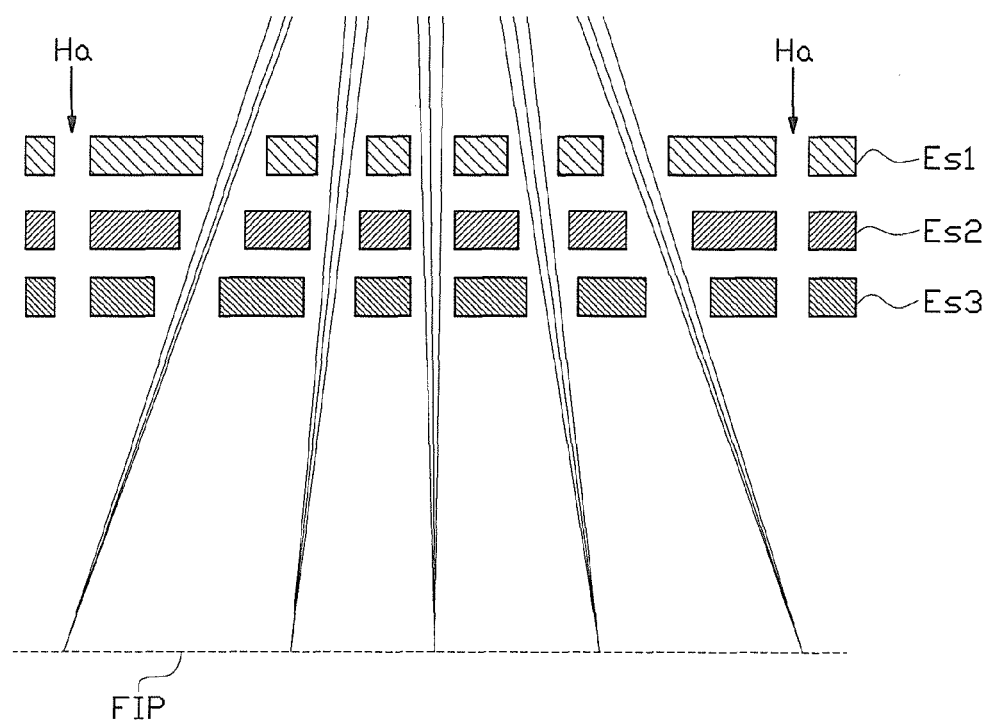
FIG. 8 illustrates a micro-einzel-lens array with field curvature correction means.

In FIG. 8, the 3-electrode lens array is shown with lens radius increasing for off-axial lenses, so as to correct field curvature. The images of each lens are by this lens structure projected onto a flat image plane. Additionally to this measure, elliptical lens holes H1 may according to the invention be used to correct for leftover astigmatism.

Figure 9:
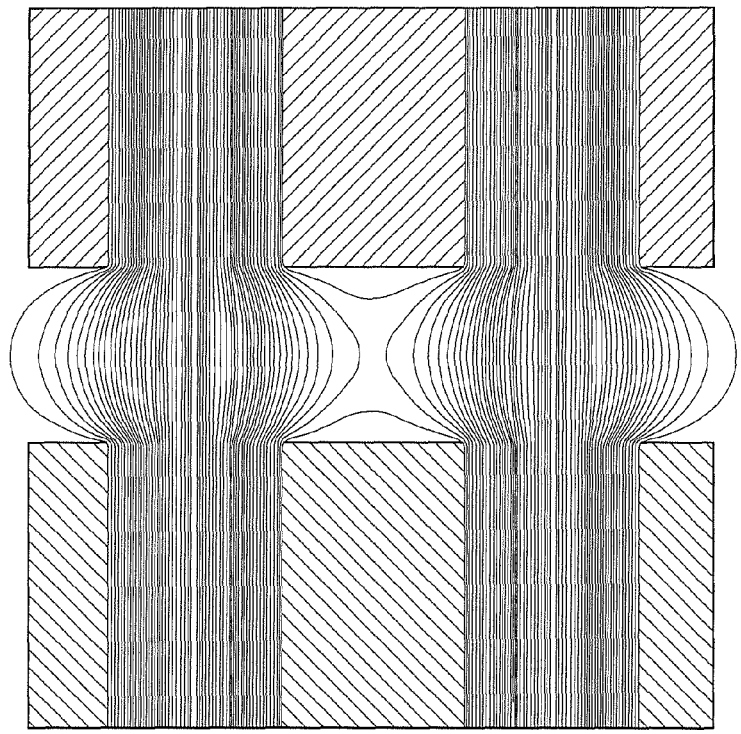
FIG. 9 illustrates the difference in size and configuration between a prior art lens and a lens in accordance with the invention.
Figure 9:
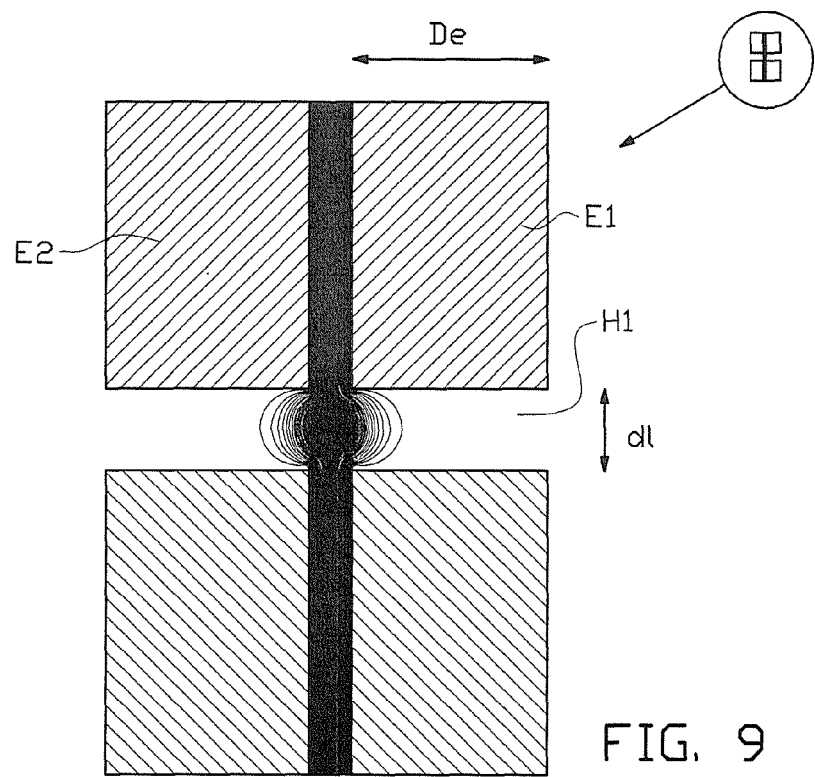

FIG. 9 provides an illustration of difference in size and configuration of a prior art lens structure, e.g. as in the earlier cited J. Vac. Sci. Technol. B 4(5), September/October 1986, in the upper figure part, relative to that of the structure according to the invention, represented on scale in the encircled figure part, and provided as an exploded view in the lower figure part. Also from the latter is evident that the largest dimension d1 in a cross section of a lens hole HL is equivalent and preferably smaller than the thickness of a lens electrode, while the lens field is confined to within the thickness of the electrode.

Apart from the concepts and all pertaining details as described in the preceding, the invention relates to all features as defined in the following set of claims as well as to all details in the annexed figures as may directly and unambiguously be derived by one skilled in the art. In the following set of claims, rather than fixating the meaning of a preceding term, any reference numbers corresponding to structures in the figures are for reason of support at reading the claim, included solely for indicating an exemplary meaning of a preceding term and are thus included between brackets.

The invention claimed:

1. A multiple beam charged particle optical system, comprising a diverging charged particle beam part, an electrostatic lens structure with at least two electrodes which form at least one lens and a lens field, said lens structure provided with lens apertures, wherein the lens structure is included within said diverging beam part, and wherein the at least two electrodes are spaced apart a distance smaller than the diameter of said at least one lens.

2. System according to claim 1, wherein the physical dimension of the at least one lens is smaller than one millimeter.

3. System according to claim 1, wherein each of the at least one lens is combined with a current limiting aperture, and a virtual aperture effected by said current limiting aperture of said lens is situated symmetrical along an optical axis of said lens.

4. System according to claim 3, wherein the virtual aperture is situated centered in said lens field.

5. System according to claim 1, wherein the diameter of at least one lens aperture is smaller than the thickness of the at least two electrodes.

6. System according to claim 1, wherein the distance between said electrodes is less than a millimeter.

7. System according to claim 1, wherein a diameter of a lens aperture related to said lens field is dependent on the distance of the relevant lens aperture to a center point of said electrode.

8. System according to claim 1, wherein the lens structure is combined with a current limiting aperture plate of which the location of current limiting apertures, within the constraints of an axial projection of a combined lens aperture is dependent on the distance of the relevant lens aperture to a center point of said at least two electrodes.

9. System according to claim 8, wherein said current limiting aperture is offset towards the center point of the at least two electrodes relative to the center of the related lens aperture with increasing distance of said current limiting aperture from said center of the at least two electrodes.

10. System according to claim 9, wherein said current limiting aperture plate forms an integrated structure with said lens.

11. System according to claim 3, wherein at least part of current limiting apertures of a current limiting aperture plate in the system is modified to provide a uniform current distribution over the beamlets of the system.

12. System according to claim 3, wherein the size of the surface area of the current limiting aperture is dependent on the distance of the relevant aperture to a center point of an array of said current limiting apertures in an aperture plate including said array.

13. System according to claim 1, wherein the at least two electrodes, comprise a silicon on isolator wafer.

14. System according to claim 1, wherein the at least two electrodes are structurally combined with at least one macro lens.

15. System according to claim 14, wherein the electrode combination is set to result into a collimating device.

16. System according to claim 14, wherein the electrode combination is set to have a zero lens effect.

17. System according to claim 1, wherein the at least two electrodes form an integrated structure with a current limiting aperture plate, and wherein such integrated structure is further integrated with three macro-electrodes, surrounding the charged particle beams (3) that can be passed through said integrated aperture lens array.

18. System according to claim 17, wherein the macro-electrode directly adjoining the integrated aperture lens array is held at a lower potential than that of the macro electrode included further away from said integrated array, and wherein the third macro electrode as taken in the main direction of the incident beam, is held at a potential lower than that of the second, intermediate macro-electrode.

19. System according to claim 18, wherein the integrated array structure is held at a potential corresponding to or lower than that of the directly adjoining macro lens.

20. System according to claim 1, wherein the filling factor for the two-electrode lenses is 10% or higher.

21. Multiple beam charged particle optical system, comprising a charged particle beam source for emitting a beam of charged particles, an electrostatic lens structure comprising a first electrode and a second electrode aligned with each other, both electrodes provided with apertures, wherein the lens structure is included within said beam, and wherein a diameter of the apertures of the first electrode is smaller than a thickness of the first electrode and/or the diameter of the apertures of the second electrode is smaller than a thickness of the second electrode.

22. A multiple beam charged particle optical system accordingly to claim 21, wherein said first and second electrodes are each provided with an array of apertures, wherein a second aperture in the second electrode, as taken in the direction of a beam to be influenced by said structure, is shifted in a radial outward direction relative to a central axis of said arrays, relative to first aperture in the first electrode, said first and second apertures in the first and second electrodes are arranged for passing a common beamlet through said first and second apertures.

23. System according to claim 22, wherein a third electrode is included in an assembly with said first and second electrode, and being structurally related to said second electrode in a manner corresponding to the relation of said second electrode to said first electrode.

24. System according to claim 22, wherein the size of an aperture, depends on its distance to a central point in the array containing said aperture.

25. System according to claim 22, wherein related openings of said two electrodes use a corresponding amount of surface area and have a corresponding shape.

26. System according to claim 25, wherein the shape of the openings (H1) is elliptical, either as taken in top view, or as taken in a cross section relative to the main direction of an incident beam.

27. System according to claim 22, wherein, in an assembly of said electrodes, said electrodes are provided with alignment holes, together forming an opening in the direction of the virtual line connecting the centers of the electrodes.

28. System according to claim 1, wherein the filling factor for the two-electrode lenses is 85% or higher.

29. System according to claim 1, wherein the physical dimension of the lens is less than a few tens of microns.

30. System according to claim 1, wherein the distance between said electrodes is less than a few tens of microns.

31. System according to claim 5, wherein the lens field is confined to within the thickness of the electrode.

32. A multiple beam charged particle optical system, comprising a diverging charged particle beam part, an electrostatic lens structure with at least two electrodes, provided with lens apertures, wherein the lens structure is included within said beam part, and wherein the two electrodes are spaced apart a distance smaller than the diameter of said aperture, wherein the diameter of at least one lens aperture is made smaller than the thickness of the corresponding electrode and wherein a diameter of a lens aperture related to a lens field increases with the distance of the corresponding lens aperture to a center point of said electrode.

33. Multiple beam charged particle optical system according to the claim 21, wherein the thickness of the first electrode and/or the thickness of the second electrode is smaller than one millimeter.

34. Multiple beam charged particle optical system according to the claim 21, wherein the thickness of the first electrode and/or the thickness of the second electrode is smaller than a few tens of microns.

35. Multiple beam charged particle system according to the claim 21, wherein the first electrode and the second electrode form at least one lens and a lens field.

36. Multiple beam charged particle system according to the claim 35, wherein the first electrode and the second electrode are spaced apart a distance smaller than the diameter of said at least one lens.

37. Multiple beam charged particle system according to the claim 35, wherein the physical dimension of the at least one lens is smaller than one millimeter.

38. Multiple beam charged particle system according to the claim 35, wherein each of the at least one lens is combined with a current limiting aperture, and a virtual aperture effected by said current limiting aperture of said lens is situated symmetrical along an optical axis of said lens.

39. Multiple beam charged particle system according to the claim 38, wherein the virtual aperture is situated centered in said lens field.

40. Multiple beam charged particle system according to the claim 38, wherein the physical dimension of the lens is less than a few tens of microns.

41. Multiple beam charged particle system according to the claim 35, wherein the distance between said electrodes is less than a few tens of microns.

42. Multiple beam charged particle system according to the claim 21, wherein the lens field is confined to within the thickness of the electrode.

43. Multiple beam charged particle system according to the claim 35, wherein a diameter of a lens aperture related to a lens field increases with the distance of the corresponding lens aperture to a center point of said electrode.

\* \* \* \* \*